(12) United States Patent
Hsu

(10) Patent No.: US 7,535,390 B2
(45) Date of Patent: May 19, 2009

(54) TIME-INTERLEAVED ANALOG-TO-DIGITAL CONVERTER AND SELF-CALIBRATION METHOD THEREOF

(75) Inventor: Cheng-Chung Hsu, Chang-Hua Hsien (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 0 days.

(21) Appl. No.: 12/017,348

(22) Filed: Jan. 22, 2008

(65) Prior Publication Data

US 2008/0174461 A1 Jul. 24, 2008

(30) Foreign Application Priority Data

Jan. 22, 2007 (TW) .............................. 96102318 A

(51) Int. Cl.
*H03M 1/06* (2006.01)
(52) U.S. Cl. ...................... 341/118; 341/120; 341/155; 341/156; 341/159
(58) Field of Classification Search ................. 341/118, 341/156
See application file for complete search history.

(56) References Cited

U.S. PATENT DOCUMENTS

| 6,014,097 A | * | 1/2000 | Brandt | ........................ 341/156 |
| 6,281,828 B1 | * | 8/2001 | Kimura et al. | .............. 341/155 |
| 6,606,049 B1 | * | 8/2003 | Marble | ........................ 341/155 |

OTHER PUBLICATIONS

Yuko Tamba, Kazuo Yamakido, A CMOS 6b 500MSample/s ADC for a Hard Disk Drive Read Channel, 1999 IEEE International Solid-State Circuits Conference.
Yuko Tamba, Kazuo Yamakido, CMOS 6-bit ADCs Reported at ISSCC, 1999 ISSCC Slide Supplement / Copyright IEEE.

* cited by examiner

*Primary Examiner*—Khai M Nguyen
(74) *Attorney, Agent, or Firm*—Winston Hsu

(57) ABSTRACT

The present invention discloses a time-interleaved analog-to-digital converter (ADC), which includes a first and a second sub-ADC and a calibration module. The calibration module includes a switch module and a calibration engine. The switch module selectively provides one of a set of reference voltage levels, which are provided by a resistor series of the first sub-ADC, onto an input signal line, which is shared by the first and the second sub-ADCs. The calibration engine calibrates pre-amplifying units of the first and the second sub-ADCs according to digital signals generated by the first and the second sub-ADCs.

12 Claims, 5 Drawing Sheets

TIME-INTERLEAVED ANALOG-TO-DIGITAL CONVERTER AND SELF-CALIBRATION METHOD THEREOF

BACKGROUND OF THE INVENTION

1. Field of the Invention

The present invention relates to an analog-to-digital converter (ADC), and more particularly, to a time-interleaved ADC and a self-calibration method thereof.

2. Description of the Prior Art

An analog-to-digital converter (ADC) is a commonly seen circuit element, which can convert an input signal of an analog format into an output signal of a digital format and has an extensive range of application. For example, the ADC can be applied in an analog front end of various communication systems. For a flash ADC or a flash-like ADC such as a folding ADC, in order to increase the operation speed, a plurality of sub-ADCs, connected in parallel and each performing a sampling operation by utilizing one of a plurality of clock signals with different phases, are usually adopted to form a single time-interleaved ADC. theoretically speaking, the more the sub-ADCs are included in the time-interleaved ADC, the faster the operation speed of the time-interleaved ADC will be.

Although the time-interleaved ADC can provide a faster signal converting speed, there will be presented some problems due to multiple sub-ADC nature of the time-interleaved ADC. For example, there will be the timing skew problem among the plurality of sub-ADCs, and the existence of gain mismatch and/or offset mismatch among the plurality of sub-ADCs caused by the factors such as fabrication process variation will also become a problem that needs to be overcome when designing the time-interleaved ADC.

SUMMARY OF THE INVENTION

It is therefore one of the objectives of the present invention to provide a self-calibration method of a time-interleaved analog-to-digital converter (ADC), so as to alleviate or eliminate the phenomena of gain mismatch and offset mismatch among a plurality of sub-ADCs.

According to an embodiment of the present invention, a time-interleaved ADC is disclosed. The time-interleaved ADC includes a first sub-ADC, a second sub-ADC, and a calibration module. The first sub-ADC includes: a first resistor series, for providing a first set of reference voltage levels; a first set of pre-amplifying units, coupled to the first resistor series and an input signal line, for amplifying a difference among each reference voltage level of the first set of reference voltage levels and an input voltage level of the input signal line to generate a first set of amplified signals; and a first digital value determining module, coupled to the first set of pre-amplifying units, for generating a first digital value according to the first set of amplified signals. The second sub-ADC includes: a second resistor series, for providing a second set of reference voltage levels; a second set of pre-amplifying units, coupled to the second resistor series and the input signal line, for amplifying a difference among each reference voltage level of the second set of reference voltage levels and the input voltage level of the input signal line to generate a second set of amplified signals; and a second digital value determining module, coupled to the second set of pre-amplifying units, for generating a second digital value according to the second set of amplified signals. The calibration module includes: a switch module, coupled to the first resistor series and the input signal line, for selectively providing one of the first set of reference voltage levels onto the input signal line; and a calibration engine, coupled to the first and the second sets of pre-amplifying units and the first and the second digital value determining modules, for calibrating the first set of pre-amplifying units according to the first digital value and calibrating the second set of pre-amplifying units according to the second digital value.

According to an embodiment of the present invention, a time-interleaved ADC is further disclosed. The time-interleaved ADC includes a first sub-ADC, a second sub-ADC, and a calibration module. The first sub-ADC includes: a first resistor series, for providing a first set of reference voltage levels; a first set of pre-amplifying units, coupled to the first resistor series and an input signal line, for amplifying a difference among each reference voltage level of the first set of reference voltage levels and an input voltage level of the input signal line to generate a first set of amplified signals; a first set of comparing units, coupled to the first set of pre-amplifying units, for generating a first set of comparing result signals according to the first set of amplified signals; and a first encoding unit, coupled to the first set of comparing units, for generating a first digital value according to the first set of comparing result signals. The second sub-ADC includes: a second resistor series, for providing a second set of reference voltage levels; a second set of pre-amplifying units, coupled to the second resistor series and the input signal line, for amplifying a difference among each reference voltage level of the second set of reference voltage levels and the input voltage level of the input signal line to generate a second set of amplified signals; a second set of comparing units, coupled to the second set of pre-amplifying units, for generating a second set of comparing result signals according to the second set of amplified signals; and a second encoding unit, coupled to the second set of comparing units, for generating a second digital value according to the second set of comparing result signals. The calibration module includes: a switch module, coupled to the first resistor series and the input signal line, for selectively providing one of the first set of reference voltage levels onto the input signal line; and a calibration engine, coupled to the first and the second sets of pre-amplifying units and the first and the second sets of comparing units, for calibrating the first set of pre-amplifying units according to the first set of comparing result signals and calibrating the second set of pre-amplifying units according to the second set of comparing result signals.

According to an embodiment of the present invention, a self-calibration method of a time-interleaved ADC is yet further disclosed, wherein the time-interleaved ADC includes at least a first and a second sub-ADC, the first sub-ADC includes at least a first converting path and a second converting path, the second sub-ADC includes at least a third converting path and a fourth converting path, the first converting path includes a first switch disposed therein, and the second converting path includes a second switch disposed therein. The self-calibration method includes: switching the first switch to let the first switch to be turned on; performing a calibration operation of the first converting path when the first switch is turned on; performing a calibration operation of the third converting path when the first switch is turned on; switching the second switch to let the first switch to be turned on; performing a calibration operation of the second converting path when the second switch is turned on; and performing a calibration operation of the fourth converting path when the second switch is turned on.

These and other objectives of the present invention will no doubt become obvious to those of ordinary skill in the art after reading the following detailed description of the preferred embodiment that is illustrated in the various figures and drawings.

DETAILED DESCRIPTION

The embodiments of the present invention provide an n-bit time-interleaved analog-to-digital converter (ADC) including a number m of sub-ADCs, wherein m and n can be any positive integer. For convenience of illustration, an example of m=2 and n=2 will be provided in the following paragraphs. However, please note that the instance of m=2 and n=2 is not meant as an limitation of the present invention, and a person of ordinary skill in the pertinent art of ADC, after understanding the concept and operation of the time-interleaved ADC in the following embodiments, should be able to apply the disclosed concept of the following embodiment, to design a time-interleaved ADC with any given number of bits, which includes any given number of sub-ADCs.

Figure 1:
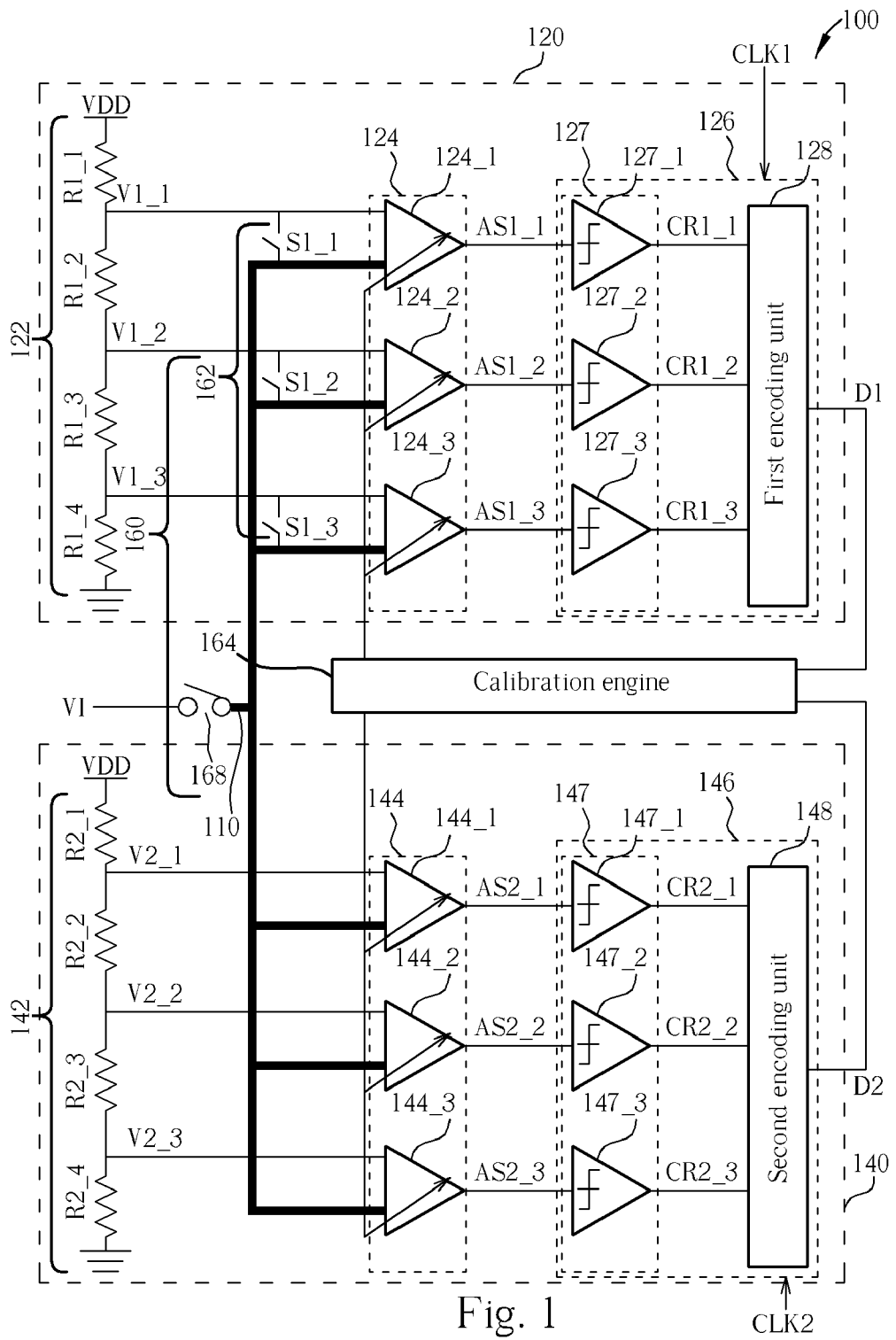
FIG. 1 shows a schematic diagram of a time-interleaved ADC according to a first embodiment of the present invention.

FIG. 1 shows a schematic diagram of a time-interleaved ADC 100 according to a first embodiment of the present invention. In this embodiment, the time-interleaved ADC 100 includes a first sub-ADC 120, a second sub-ADC 140, and a calibration module 160. The first sub-ADC 120 performs a sampling operation according to a first clock CLK1, so as to convert an input voltage level VI on a signal input line 110 into a first digital value D1, and the second sub-ADC 140 performs a sampling operation according to a second clock CLK2, so as to convert the input voltage level VI on the signal input line 110 into a second digital value D2. In this embodiment, in order to attain the time-interleaved operation, the second clock CLK2 is an inverse clock of the first clock CLK1; that is, a phase difference between the first clock CLK1 and the second clock CLK2 is 180 degrees. The calibration module 160 is utilized for calibrating a mismatch between the first sub-ADC 120 and the second sub-ADC 140, and calibrating an input voltage shift between the first sub-ADC 120 and the second sub-ADC 140.

The first sub-ADC 120 includes a first resistor series 122, a first set of pre-amplifying units 124, and a first digital value determining module 126. The first resistor series 122 includes resistors R1_1, R1_2, R1_3, and R1_4, and is utilized for providing a first set of reference voltage levels comprised of reference voltage levels V1_1, V1_2, and V1_3. The first set of pre-amplifying units 124 includes pre-amplifying units 124_1, 124_2, and 124_3, and is utilized for amplifying a difference between the input voltage level VI of the input signal line and each of the first set of reference voltage levels, so as to generate a first set of amplified signals comprised of amplified signals AS1_1, AS1_2, and AS1_3. The first digital value determining module 126 includes a first set of comparing units 127 and a first encoding unit 128. The first set of comparing units 127 is comprised of comparing units 127_1, 127_2, and 127_3, and these three comparing units are respectively utilized for comparing each of the reference voltage levels against the input voltage level VI according to the amplified signals AS1_1, AS1_2, and AS1_3, so as to respectively output comparing result signals CR1_1, CR1_2, and CR1_3, which use logic values '0' or '1' to represent the comparing results. The comparing result signals CR1_1, CR1_2, and CR1_3 then constitutes a first set of comparing result signals. The first encoding unit 128 is utilized for generating a first digital value D1 according to the first set of comparing result signals, wherein the first digital value D1 is a 2-bit digital value in this embodiment, and the first digital value D1 can be of value '11', '10', '01', or '00'.

From the above description, it can be generalized that the first sub-ADC 120 is made up of a plurality of converting paths. For example, the first resistor series 122 providing the reference voltage level V1_1, the pre-amplifying unit 124_1, the comparing unit 127_1, and the first encoding unit 128 constitute a first converting path; the first resistor series 122 providing the reference voltage level V1_2, the pre-amplifying unit 124_2, the comparing unit 127_2, and the first encoding unit 128 constitute a second converting path; and the first resistor series 122 providing the reference voltage level V1_3, the pre-amplifying unit 124_3, the comparing unit 127_3, and the first encoding unit 128 constitute a third converting path.

As shown in FIG. 1, since the scheme of the second sub-ADC 140 is the same as that of the first sub-ADC 120, and the second sub-ADC 140 includes circuit elements corresponding to the first sub-ADC 120, such as a second resistor series 142, a second set of pre-amplifying units 144, and a second digital value determining module 146, further explanation of the scheme of the second sub-ADC 140 is omitted herein for the sake of brevity.

In addition to the mismatches of the other elements in the circuit, since there may also exist a mismatch between the first resistor series 122 and the second resistor series 142, the reference voltage levels V1_1, V1_2, and V1_3 may not necessarily be respectively equal to the reference voltage levels V2_1, V2_2, and V2_3. Therefore in this embodiment, when the calibration module 160 performs the calibration operation on the first sub-ADC 120 and the second sub-ADC 140, the calibration module 160 will utilize the first set of reference voltage levels provided by the first resistor series 122 as the calibration references for all of the sub-ADCs. By doing so, the calibration operation is able to not only eliminate the mismatch phenomenon (such as the gain mismatch and the offset mismatch) and calibrate the input voltage shift, but also compensate for the errors caused by the mismatch between the first resistor series 122 and the second resistor series 142. Thus, the present invention is different from conventional calibration scheme, which respectively uses the first resistor series 122 as the calibration reference for the first sub-ADC 120 and the second resistor series 142 as the calibration reference for the second sub-ADC 140, and the errors caused by the mismatch between the two resistor series remains even after performing the calibration operation.

In this embodiment, the calibration module 160 includes a switch module 162, a calibration engine 164, and an input switch 168, wherein the switch module 162 is comprised of switches S1_1, S1_2, and S1_3. All of the switches in the switch module 162 are in a turn-off state when the time-interleaved ADC 100 performs the normal analog-to-digital converting operation, and are selectively turned on to provide one of the first set of reference voltage levels onto the input signal line 110 when the time-interleaved ADC 100 performs the self-calibration operation. The calibration engine 164 is utilized for calibrating parameters for one of the first set of pre-amplifying units 124 according to the first digital value D1 and calibrating parameters for one of the second set of pre-amplifying units 144 according to the second digital value D2, when the switch module 162 provides one of the first set of reference voltage levels onto the input signal line 110. The input switch 168 is in a turn-on state when the time-interleaved ADC 100 performs the normal analog-to-digital converting operation, so as to transmit the external analog signals to the first sub-ADC 120 and the second sub-ADC 140, and the input switch 168 is in the turn-off state when the time-interleaved ADC 100 performs the self-calibration operation, so as to prevent the level of the external signals from affecting the calibration operation.

To be more specific, when the time-interleaved ADC 100 performs the normal analog-to-digital conversion, all of the switches S1_1, S1_2, and S1_3 are in the turn-off state, and the input voltage level VI on the signal input line 110 will be determined by the externally inputted analog signals; when the time-interleaved ADC 100 performs the self-calibration operation, only one of the switches S1_1, S1_2, and S1_3 will be in the turn-on state, and the other two switches are in the turn-off state. For example, when the switch S1_1 is in the turn-on state and the switches S1_2 and S1_3 are in the turn-off state, the input voltage level VI will be equal to the reference voltage level VI_1, and two input nodes of the pre-amplifying unit 124_1 will have the same voltage level. At this time desirably, both the first digital value D1 and the second digital value D2 should vary irregularly between "11" and "10". However, if the first digital value D1 and/or the second digital value D2 do not fit in with the above state at this time, then the calibration engine 164 will adjust the offset of the pre-amplifying unit 124_1 and/or the pre-amplifying unit 144_1, so as to result in irregular variation of both the first digital value D1 and the second digital value D2 between "11" and "10", or let both the first digital value D1 and the second digital value D2 become as close to the above state as possible.

When the switch S1_2 is in the turn-on state and the switches S1_1 and S1_3 are in the turn-off state, the input voltage level VI will be equal to the reference voltage level VI_2, and desirably both the first digital value D1 and the second digital value D2 should vary irregularly between "10" and "10". However, if the first digital value D1 and/or the second digital value D2 do not fit in with the above state at this time, then the calibration engine 164 will adjust the offset of the pre-amplifying unit 124_2 and/or the pre-amplifying unit 144_2, so as to result in the irregular variation of both the first digital value D1 and the second digital value D2 between "10" and "10", or let both the first digital value D1 and the second digital value D2 become as close to the above state as possible.

Similarly, when the switch S1_3 is in the turn-on state and the switches S1_1 and S1_2 are in the turn-off state, the input voltage level VI will be equal to the reference voltage level VI_3, and desirably both the first digital value D1 and the second digital value D2 should vary irregularly between "01" and "00". However, if the first digital value D1 and/or the second digital value D2 do not fit in with the above state at this time, then the calibration engine 164 will adjust the offset of the pre-amplifying unit 124_3 and/or the pre-amplifying unit 144_3, so as to result in the irregular variation of both the first digital value D1 and the second digital value D2 between "01" and "00", or let both the first digital value D1 and the second digital value D2 become as close to the above state as possible.

The operational details and the required circuit configuration details related to the purpose of determining the parameters according to the variations of the first digital value D1 and the second digital value D2, to adjust the offset of the pre-amplifying units 124_1, 124_2, 124_3, 144_1, 144_2, 144_3 when the time-interleaved ADC 100 performs the self-calibration operation, as mentioned above, are all well known to those of ordinary skill in the analog-to-digital conversion art, and thus further explanation of the details and operations are omitted herein for the sake of brevity.

Figure 2:
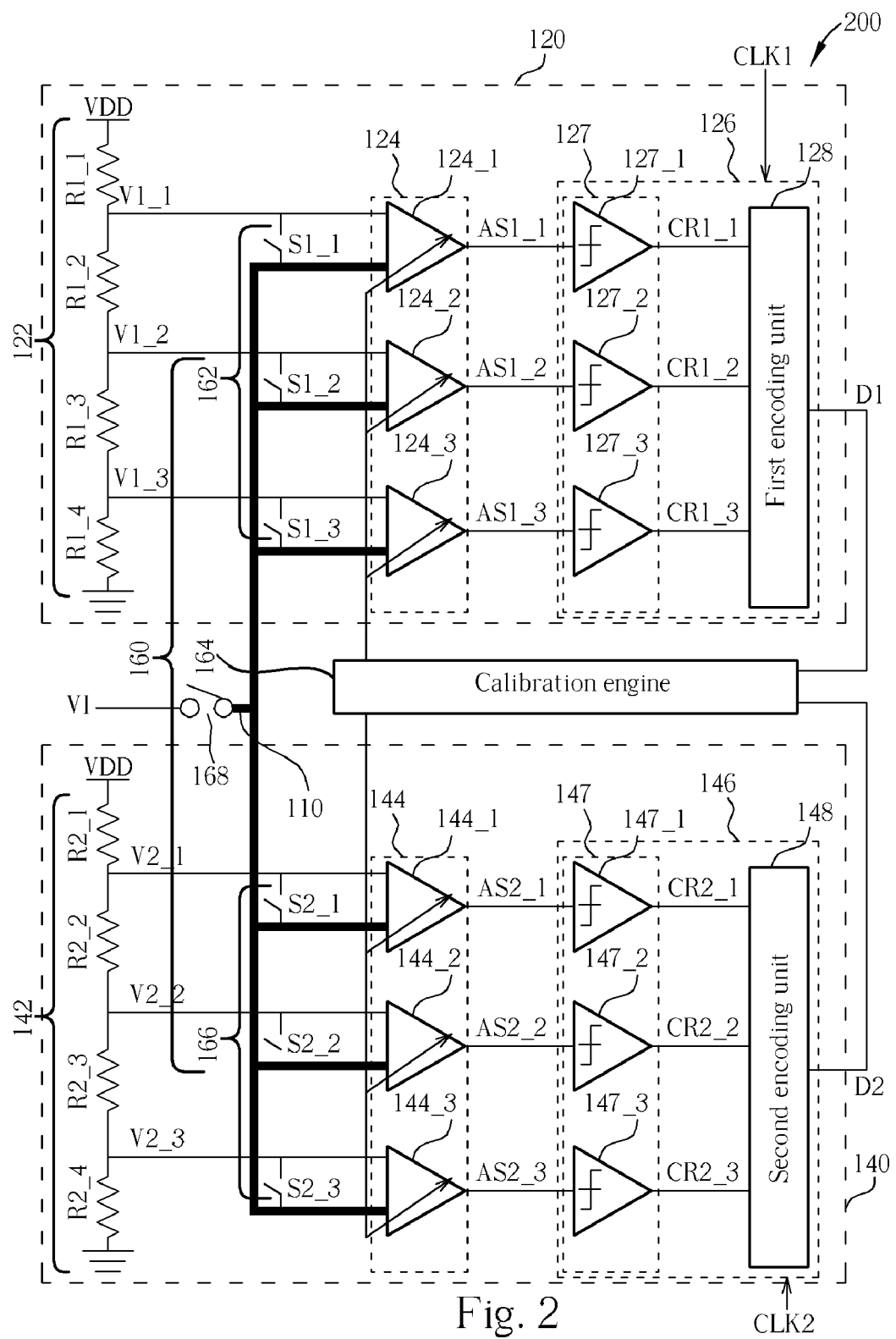
FIG. 2 shows a schematic diagram of a time-interleaved ADC according to a second embodiment of the present invention.

FIG. 2 shows a schematic diagram of a time-interleaved ADC 200 according to a second embodiment of the present invention. The components included by the time-interleaved ADC 200 shown in FIG. 2 are in most part the same as those included by the time-interleaved ADC 100 shown in FIG. 1. The main difference between the time-interleaved ADC 200 and the time-interleaved ADC 100 is that the calibration module 160 in the time-interleaved ADC 200 further includes a dummy switch module 166 comprised of switches S2_1, S2_2, and S2_3. No matter the time-interleaved ADC 100 performs the normal operation or the self-calibration operation, the switches S2_1, S2_2, and S2_3 in the dummy switch module 166 are maintained in the turn-off state, and the switching operation thereof is never performed. One of the objectives of adding the dummy switch module 166 is to enhance the circuit symmetry of the time-interleaved ADC 200 so as to further reduce the mismatch between the first sub-ADC 120 and the second sub-ADC 140 in the time-interleaved ADC 200.

Figure 3:
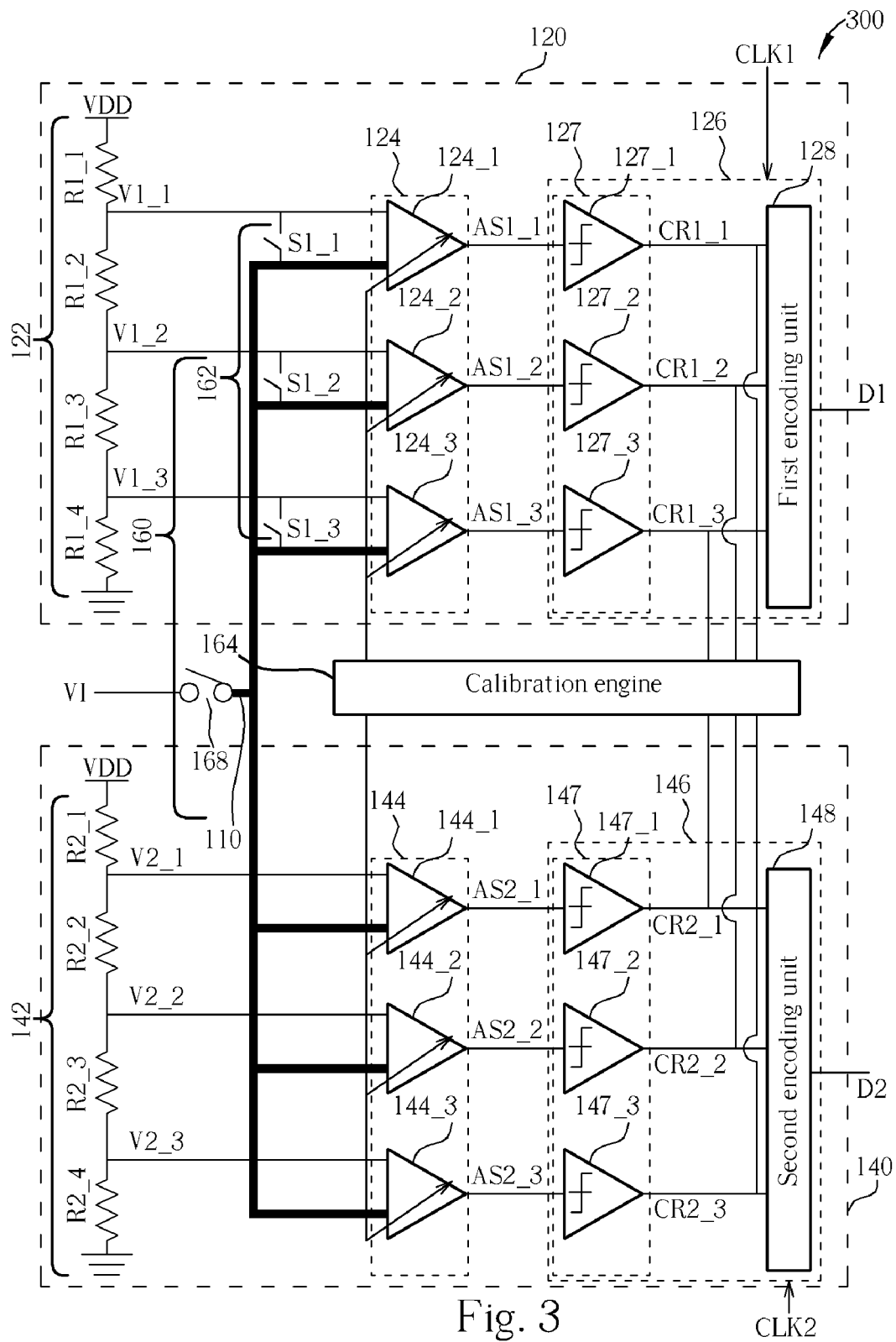
FIG. 3 shows a schematic diagram of a time-interleaved ADC according to a third embodiment of the present invention.

FIG. 3 shows a schematic diagram of a time-interleaved ADC 300 according to a third embodiment of the present invention. The components included by the time-interleaved ADC 300 shown in FIG. 3 are in most part the same as those included by the time-interleaved ADC 100 shown in FIG. 1. The main difference between the time-interleaved ADC 300 and the time-interleaved ADC 100 is that the calibration engine 164 in the time-interleaved ADC 300 calibrates the first set of pre-amplifying units 124 according to the first set of comparing result signals, and calibrates the second set of pre-amplifying units 144 according to the second set of comparing result signals. To be more specific, when the time-interleaved ADC 300 performs the normal operation, all of the switches S1_1, S1_2, and S1_3 are in the turn-off state, and the input voltage level VI on the signal input line 110 will be determined by the externally inputted analog signals; when the time-interleaved ADC 100 performs the self-calibration operation, only one of the switches S1_1, S1_2, and S1_3 will be in the turn-on state, and the other two switches are in the turn-off state. For example, when the switch S1_1 is in the turn-on state and the switches S1_2 and S1_3 are in the turn-off state, the input voltage level VI will be equal to the reference voltage level VI_1, and desirably both the comparing result signals CR1_1 and CR2_1 should vary irregularly between "1" and "0". However, if the comparing result signals CR1_1 and/or CR2_1 do not fit in with the above state at this time, then the calibration engine 164 will adjust the offset of the pre-amplifying unit 124_1 and/or the pre-amplifying unit 144_1, so as to result in the irregular variation of both the comparing result signals CR1_1 and CR2_1 between "1" and "0", or let both the comparing result signals CR1_1 and CR2_1 become as close to the above state as possible.

When the switch S1_2 is in the turn-on state and the switches S1_1 and S1_3 are in the turn-off state, the input voltage level VI will be equal to the reference voltage level VI_2, and desirably both the comparing result signals CR1_2 and CR2_2 should vary irregularly between "1" and "0". However, if the comparing result signals CR1_2 and/or CR2_2 do not fit in with the above state at this time, then the calibration engine 164 will adjust the offset of the pre-amplifying unit 124_2 and/or the pre-amplifying unit 144_2, so as to result in the irregular variation of both the comparing result signals CR1_2 and CR2_2 between "1" and "0", or let both the comparing result signals CR1_2 and CR2_2 become as close to the above state as possible.

Similarly, when the switch S1_3 is in the turn-on state and the switches S1_1 and S1_2 are in the turn-off state, the input voltage level VI will be equal to the reference voltage level VI_3, and desirably both the comparing result signals CR1_1 and CR2_3 should vary irregularly between "1" and "0". However, if the comparing result signals CR1_3 and/or CR2_3 do not fit in with the above state at this time, then the calibration engine 164 will adjust the offset of the pre-amplifying unit 124_3 and/or the pre-amplifying unit 144_3, so as to result in the irregular variation of both the comparing result signals CR1_3 and CR2_3 between "1" and "0", or let both the comparing result signals CR1_3 and CR2_3 become as close to the above state as possible.

Figure 4:
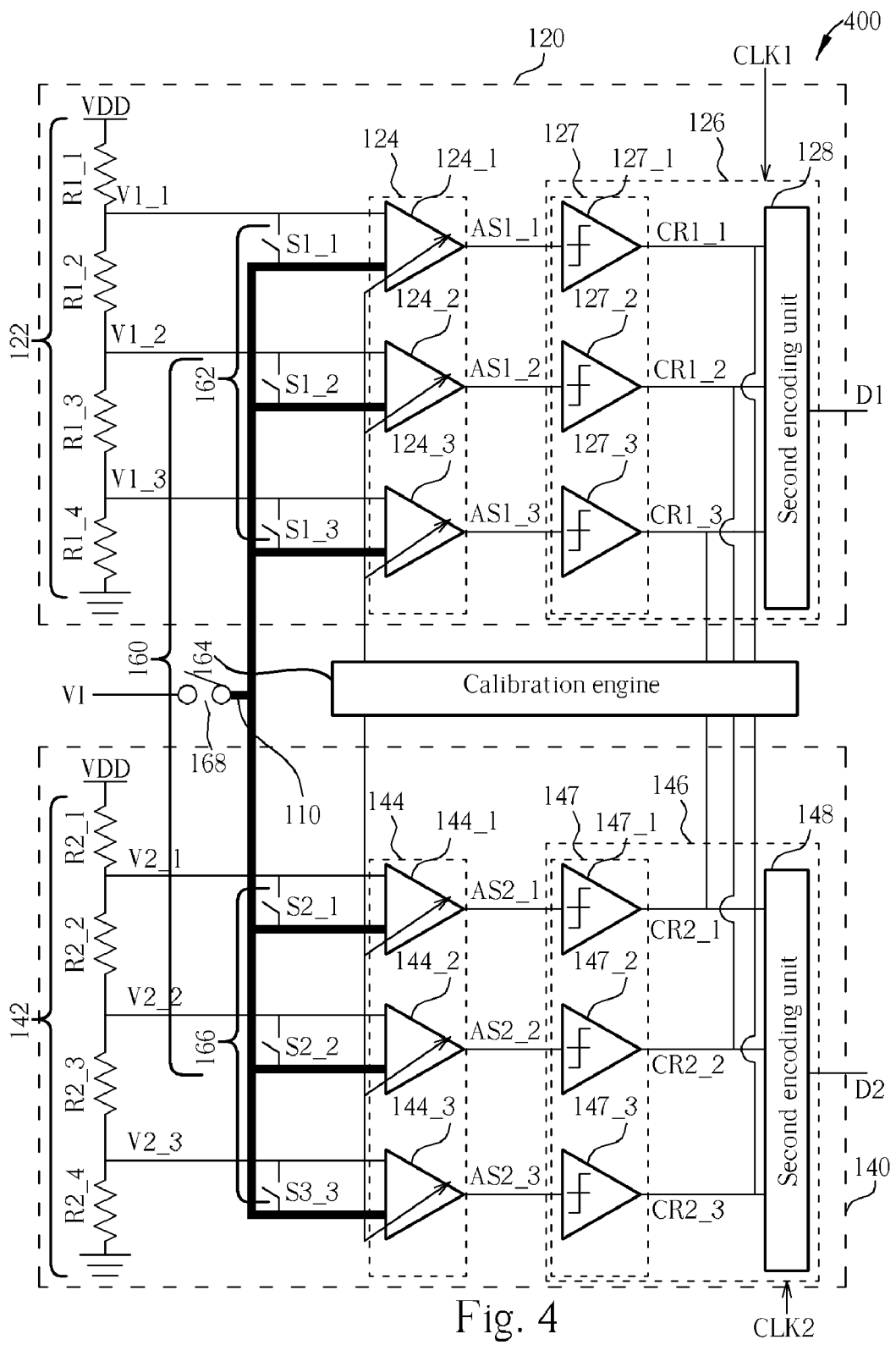
FIG. 4 shows a schematic diagram of a time-interleaved ADC according to a fourth embodiment of the present invention.

FIG. 4 shows a schematic diagram of a time-interleaved ADC 400 according to a fourth embodiment of the present invention. The components included by the time-interleaved ADC 400 shown in FIG. 4 are in most part the same as those included by the time-interleaved ADC 300 shown in FIG. 3. The main difference between the time-interleaved ADC 400 and the time-interleaved ADC 300 is that the calibration module 160 in the time-interleaved ADC 400 further includes a dummy switch module 166 comprised of switches S2_1, S2_2, and S2_3. No matter the time-interleaved ADC 100 performs the normal operation or the self-calibration operation, the switches S2_1, S2_2, and S2_3 in the dummy switch module 166 are maintained in the turn-off state, and the switching operation thereof is never performed. One of the objectives of adding the dummy switch module 166 is to enhance the circuit symmetry of the time-interleaved ADC 400 so as to further reduce the mismatch between the first sub-ADC 120 and the second sub-ADC 140 in the time-interleaved ADC 200.

Figure 5:
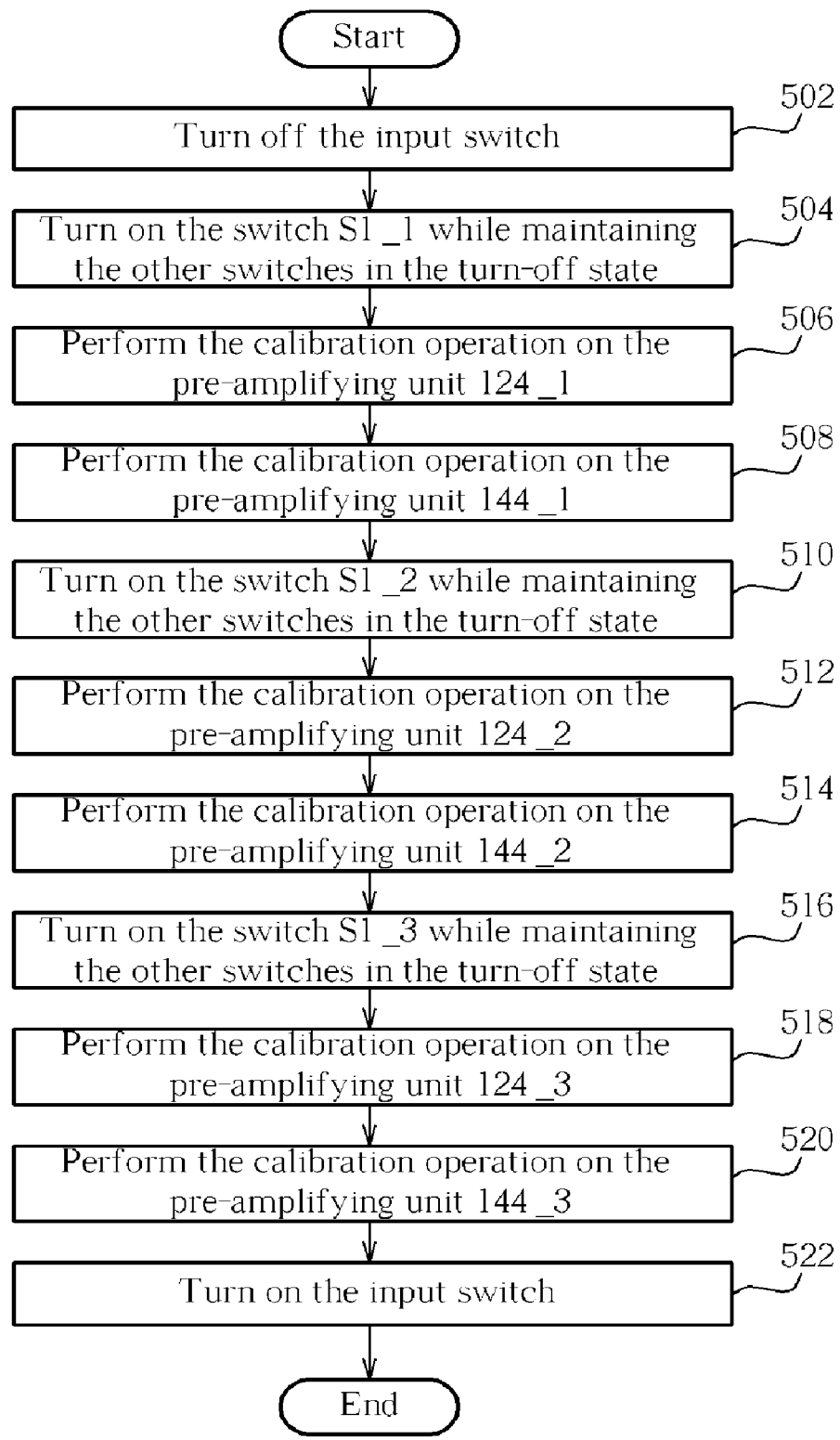
FIG. 5 is a flowchart showing the time-interleaved ADC performing the self-calibration operation according to an embodiment of the present invention.

Finally, FIG. 5 is a flowchart showing the time-interleaved ADC 100, 200, 300, or 400 performing the self-calibration operation according to an embodiment of the present invention. When the time-interleaved ADC is to perform the self-calibration operation, the time-interleaved ADC will first switch the input switch 168 to the turn-off state in order to prevent the external signals from affecting the results of the self-calibration operation (step 502). Next, the time-interleaved ADC will perform the self-calibration operation for each of the converting paths in the first sub-ADC 120 and the second sub-ADC 140. In this embodiment, the time-interleaved ADC will first switch the switch S1_1 to the turn-on state while maintaining the other switches (the switches S1_2, S1_3, and the switches S2_1, S2_2, S2_3 in the dummy switch module 166) in the turn-off state (step 504). Under this state, the time-interleaved ADC will utilize the calibration engine 164 for extracting the first digital value D1 or the comparing result signals CR1_1, CR1_2, and CR1_3 so as to perform the calibration operation on the pre-amplifying units 124_1 (step 506), and extracting the second digital value D2 or the comparing result signals CR2_1, CR2_2, and CR2_3 so as to perform the calibration operation on the pre-amplifying units 144_1 (step 508).

Next, the time-interleaved ADC will switch the switch S1_2 to the turn-on state while maintaining the other switches S1_1, S1_3, S2_1, S2_2, and S2_3 in the turn-off state (step 510). Under this state, the time-interleaved ADC will perform the calibration operation on the pre-amplifying units 124_2 and 144_2 (steps 512 and 514). Similarly, then the time-interleaved ADC will switch the switch S1_3 to the turn-on state while maintaining the other switches S1_1, S1_2, S2_1, S2_2, and S2_3 in the turn-off state (step 516). Under this state, the time-interleaved ADC will perform the calibration operation on the pre-amplifying units 124_3 and 144_3 (steps 518 and 520). In this way, all of the self-calibration operation will be completed, and finally the time-interleaved ADC will switch the input switch 168 again to the turn-on state and maintain the other switches S1_1, S1_2, S1_3, S2_1, S2_2, and S2_3 in the turn-off state, so as to return to the normal analog-to-digital converting operation.

It becomes apparent from the self-calibration operation flowchart shown in FIG. 5 that the present invention only utilizes the switch operation of the switch module corresponding to a single sub-ADC in performing the self-calibration operation for a plurality of sub-ADCs. Even though the other sub-ADCs also includes similar dummy switch module, the function of the dummy switch module is merely for improving matching between/among the sub-ADCs, and the switching operation or turning-on thereof is never performed in the process of self-calibration operation. In comparison with the conventional method of utilizing respective independent resistor series as the calibration reference, the present invention method can further compensate for the mismatch effect between the resistor series, so as to attain a better calibration result.

Please note herein that although all of the above embodiments only use adjusting the pre-amplifying units as the example of the calibration scheme, this is not meant as a limitation of the present invention. A person of average skill in the pertinent art should understand that the calibration engine 164 also can choose to perform the adjusting operation of other components in each of the converting paths, such as the resistor series, the comparing units, the encoding unit, or others not illustrated in the embodiments of the present invention, so as to attain the purpose of the self-calibration operation.

After the time-interleaved ADCs in the above embodiments have completed the self-calibration operation mentioned above, the mismatch between the first sub-ADC 120 and the second sub-ADC 140 in each of the time-interleaved ADCs will be effectively lowered to the minimum (or even be entirely eliminated). In this way, the first sub-ADC 120 and the second sub-ADC 140 will be able to correspond to approximately the same analog-to-digital converting curve.

Those skilled in the art will readily observe that numerous modifications and alterations of the device and method may be made while retaining the teachings of the invention.

What is claimed is:
1. A time-interleaved analog-to-digital converter (ADC), comprising:
 a first sub-ADC, comprising:
  a first resistor series, for providing a first set of reference voltage levels;
  a first set of pre-amplifying units, coupled to the first resistor series and an input signal line, for amplifying a difference among each reference voltage level of the first set of reference voltage levels and an input voltage level of the input signal line to generate a first set of amplified signals; and
  a first digital value determining module, coupled to the first set of pre-amplifying units, for generating a first digital value according to the first set of amplified signals;

a second sub-ADC, comprising:
  a second resistor series, for providing a second set of reference voltage levels;
  a second set of pre-amplifying units, coupled to the second resistor series and the input signal line, for amplifying a difference among each reference voltage level of the second set of reference voltage levels and the input voltage level of the input signal line to generate a second set of amplified signals; and
  a second digital value determining module, coupled to the second set of pre-amplifying units, for generating a second digital value according to the second set of amplified signals; and
a calibration module, comprising:
  a switch module, coupled to the first resistor series and the input signal line, for selectively providing one reference voltage level of the first set of reference voltage levels onto the input signal line; and
  a calibration engine, coupled to the first and the second sets of pre-amplifying units and the first and the second digital value determining modules, for calibrating the first set of pre-amplifying units according to the first digital value and calibrating the second set of pre-amplifying units according to the second digital value.

2. The time-interleaved ADC of claim 1, wherein the calibration engine calibrates offsets of a plurality of pre-amplifying units in the first set of pre-amplifying units according to the first digital value and calibrates offsets of a plurality of pre-amplifying units in the second set of pre-amplifying units according to the second digital value.

3. The time-interleaved ADC of claim 1, wherein the calibration module further comprises:
  a dummy switch module, coupled to the second resistor series and the input signal line, the dummy switch module comprising a plurality of switches fixedly staying in a turn-off state.

4. A time-interleaved analog-to-digital converter (ADC), comprising:
  a first sub-ADC, comprising:
    a first resistor series, for providing a first set of reference voltage levels;
    a first set of pre-amplifying units, coupled to the first resistor series and an input signal line, for amplifying a difference among each reference voltage level of the first set of reference voltage levels and an input voltage level of the input signal line to generate a first set of amplified signals;
    a first set of comparing units, coupled to the first set of pre-amplifying units, for generating a first set of comparing result signals according to the first set of amplified signals; and
    a first encoding unit, coupled to the first set of comparing units, for generating a first digital value according to the first set of comparing result signals;
  a second sub-ADC, comprising:
    a second resistor series, for providing a second set of reference voltage levels;
    a second set of pre-amplifying units, coupled to the second resistor series and the input signal line, for amplifying a difference among each reference voltage level of the second set of reference voltage levels and the input voltage level of the input signal line to generate a second set of amplified signals;
    a second set of comparing units, coupled to the second set of pre-amplifying units, for generating a second set of comparing result signals according to the second set of amplified signals; and
    a second encoding unit, coupled to the second set of comparing units, for generating a second digital value according to the second set of comparing result signals; and
  a calibration module, comprising:
    a switch module, coupled to the first resistor series and the input signal line, for selectively providing one reference voltage level of the first set of reference voltage levels onto the input signal line; and
    a calibration engine, coupled to the first and the second sets of pre-amplifying units and the first and the second sets of comparing units, for calibrating the first set of pre-amplifying units according to the first set of comparing result signals and calibrating the second set of pre-amplifying units according to the second set of comparing result signals.

5. The time-interleaved ADC of claim 4, wherein the calibration engine calibrates offsets of a plurality of pre-amplifying units in the first set of pre-amplifying units according to the first set of comparing result signals and calibrates offsets of a plurality of pre-amplifying units in the second set of pre-amplifying units according to the second set of comparing result signals.

6. The time-interleaved ADC of claim 4, wherein the calibration module further comprises:
  a dummy switch module, coupled to the second resistor series and the input signal line, the dummy switch module comprising a plurality of switches fixedly staying in a turn-off state.

7. A self-calibration method of a time-interleaved analog-to-digital converter (ADC), the time-interleaved ADC comprising at least a first and a second sub-ADC, the first sub-ADC comprising at least a first converting path and a second converting path, the second sub-ADC comprising at least a third converting path and a fourth converting path, the first converting path comprising a first switch disposed therein, the second converting path comprising a second switch disposed therein, the self-calibration method comprising:
  switching the first switch to let the first switch be turned on;
  performing a calibration operation of the first converting path when the first switch is turned on;
  performing a calibration operation of the third converting path when the first switch is turned on;
  switching the second switch to let the second switch be turned on;
  performing a calibration operation of the second converting path when the second switch is turned on; and
  performing a calibration operation of the fourth converting path when the second switch is turned on.

8. The self-calibration method of claim 7, wherein the calibration operation of the first converting path is adjusting an amplifying unit in the first converting path.

9. The self-calibration method of claim 7, wherein the third converting path comprises a third switch disposed therein, the fourth converting path comprises a fourth switch disposed therein, and the third switch and the fourth switch are maintained in a turn-off state continuously.

10. The self-calibration method of claim 7, wherein the first converting path comprises a first comparing unit disposed therein, the second converting path comprises a second comparing unit disposed therein, and the calibration operation of the first converting path and the calibration operation of the second converting path are performed according to comparing results of the first comparing unit and the second comparing unit.

11. The self-calibration method of claim 7, wherein the calibration operation of the first converting path and the calibration operation of the second converting path are performed according to a first digital value outputted by the first sub-ADC.

12. The self-calibration method of claim 7, wherein the first sub-ADC operates according to a first clock signal, and the second sub-ADC operates according to a second clock signal.

* * * * *